(12) United States Patent
Van Liere

(10) Patent No.: US 9,417,300 B2
(45) Date of Patent: Aug. 16, 2016

(54) DIRECT DIGITAL RECEIVER WITH LOCAL FREE RUNNING CLOCK

(75) Inventor: Filips Van Liere, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 991 days.

(21) Appl. No.: 13/510,995

(22) PCT Filed: Dec. 13, 2010

(86) PCT No.: PCT/IB2010/055769
§ 371 (c)(1),
(2), (4) Date: May 21, 2012

(87) PCT Pub. No.: WO2011/073880
PCT Pub. Date: Jun. 23, 2011

(65) Prior Publication Data
US 2012/0286787 A1 Nov. 15, 2012

(30) Foreign Application Priority Data

Dec. 17, 2009 (EP) .................................. 09179578

(51) Int. Cl.
*G01V 3/00* (2006.01)
*G01R 33/36* (2006.01)
(52) U.S. Cl.
CPC ........ *G01R 33/3621* (2013.01); *G01R 33/3692* (2013.01)
(58) Field of Classification Search
CPC .................................................. G01R 33/3621
USPC ................................................. 324/322, 318
See application file for complete search history.

(56) References Cited

U.S. PATENT DOCUMENTS

| 5,170,123 A | 12/1992 | Holland et al. |
| 5,513,209 A * | 4/1996 | Holm ............................. 375/354 |

(Continued)

FOREIGN PATENT DOCUMENTS

| WO | 2004089211 A2 | 10/2004 |
| WO | 2006048816 A1 | 5/2006 |

(Continued)

OTHER PUBLICATIONS

Perez, P., et al.; Undersampling to acquire nuclear magnetic resonance images; 2004; Medical Engineering & Physics; 26:523-529.

*Primary Examiner* — Louis Arana

(57) ABSTRACT

The invention relates to direct digital receiver for an RF coil (11, 12, 13, 200), in particular of a magnetic resonance imaging system (1), for providing a digital sample output signal at a digital operating frequency in a time base of a system clock (222), the receiver comprising: —an analogue-to-digital converter (214) for converting an analogue signal received from the RF coil (11, 12, 13, 200) to a digital sample input signal, the analogue-to-digital converter (214) being driven by a local clock, a local clock oscillator (400) adapted for providing the local clock in a local clock time base to the analogue-to-digital converter (214), the local clock time base being independent of the system clock time base, a phase detector (402) adapted for determining a phase difference (512) between the system clock (222) and the local clock, a resampling unit (224) adapted for resampling the digital sample input signal to the digital sample output signal using said phase difference (512).

17 Claims, 4 Drawing Sheets

(56) References Cited

U.S. PATENT DOCUMENTS

| | | |
|---|---|---|
| 6,167,134 A | 12/2000 | Scott et al. |
| 6,833,875 B1 * | 12/2004 | Yang et al. .................... 348/665 |
| 7,123,009 B1 | 10/2006 | Scott |
| 7,263,049 B2 | 8/2007 | Modrie et al. |
| 8,049,505 B2 * | 11/2011 | Van Liere .................... 324/322 |
| 2002/0079892 A1 | 6/2002 | Baumgartl et al. |
| 2003/0021370 A1 * | 1/2003 | Menkhoff .................... 375/355 |
| 2006/0066312 A1 | 3/2006 | Watkins et al. |
| 2007/0165762 A1 | 7/2007 | Darr |
| 2008/0315928 A1 | 12/2008 | Waheed et al. |

FOREIGN PATENT DOCUMENTS

| | | |
|---|---|---|
| WO | 2008075268 A1 | 6/2008 |
| WO | 2008155703 A1 | 12/2008 |
| WO | 2009074924 A1 | 6/2009 |

* cited by examiner

DIRECT DIGITAL RECEIVER WITH LOCAL FREE RUNNING CLOCK

FIELD OF THE INVENTION

The present invention relates to a direct digital receiver, a magnetic resonance imaging apparatus comprising an RF coil and a direct digital receiver, a method of providing an RF signal of an RF coil, as well as a computer program product.

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field whose direction at the same time defines an axis (normally the z-axis) of the coordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view, the distribution of the individual nuclear spins produces an overall magnetization which can be deflected out of the state of equilibrium by application of an electromagnetic pulse of appropriate frequency (RF pulse) while the magnetic field extends perpendicular to the z-axis (also referred to as longitudinal axis), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant T1 (spin lattice or longitudinal relaxation time), and the magnetization in the direction perpendicular to the z direction relaxes with a second time constant T2 (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to an MR image by means of Fourier transformation.

In order to process the signal picked up in the receiving coils for later visualization via the MR image, the signal typically needs to be amplified, filtered and digitized. Generally, a direct digital receiver (DDR) comprising an analogue-to-digital converter (ADC) that samples the MR signal directly without use of an intermediate frequency and a subsequent digital down converter is used to convert the analogue MR (magnetic resonance) signal to a digital baseband signal. The replacement of all analogue RF (radio frequency) signal transport by digital RF signal transport within RF coil assemblies reduces the physical extend of analogue RF components required for MR signal reception. This enables to simplify RF coil design and provides opportunities to standardize coil assembly components.

BACKGROUND OF THE INVENTION

WO 2008/075268 A1 does disclose a direct digital receiver for an RF coil, in particular of a magnetic resonance imaging system. To obtain that the sampling frequency of an analogue-to-digital converter of the digital receiver can be chosen independently of the digital operating frequency at which the subsequent digital down converter operates, a resampling unit is introduced which is coupled between said analogue-to-digital converter and said digital down converter.

However, the resampling DDR still requires the ADC sampling frequency to remain in frequency lock with the system clock used to control the time critical digital functions of the system.

Frequency lock on the ADC clock has two disadvantages: First, it requires a system clock to be distributed to the ADC. This limit is restricting the ADC and associated clock to locations where the system clock is present. Second, the derivation of an ADC sampling frequency from the recovered system clock inherently introduces noise present on the system clock into the ADC clock. The fidelity of the system clock is difficult to maintain as it is typically traversing various digital electronic assemblies.

SUMMARY OF THE INVENTION

From the foregoing it is readily appreciated that there is a need for an improved direct digital receiver. It is consequently an object of the invention to provide a direct digital receiver with reduced complexity of components.

In accordance with the invention, a direct digital receiver for an RF coil, in particular of a magnetic resonance imaging system, is disclosed for providing a digital sample output signal at a digital operating frequency in a time base of system clock. The receiver comprises an analogue-to-digital converter for converting an analogue signal received from the RF coil to a digital sample input signal, wherein the analogue-to-digital converter is driven by a local clock. Further the receiver comprises a local clock oscillator adapted for providing the local clock in a local clock time base to the analogue-to-digital converter, wherein the local clock time base is independent of the system clock time base. Further the receiver comprises a phase detector adapted for determining a phase difference between the system clock and the local clock, as well as a resampling unit adapted for resampling the digital sample input signal to the digital sample output signal using said phase difference.

This has the advantage that the system clock does not longer have to be distributed to the ADC. This increases the design freedom regarding the ADC and associated clock locations since for driving the ADC the system clock is not required anymore.

Preferably, the local clock oscillator is a crystal oscillator, which has the additional advantage, that voltage control is no longer required on the oscillator, whereas in state of the art receivers voltage controlled crystal oscillator (VCXO) was required to adjust the ADC clock frequency depending on the phase difference between the system clock and the ADC clock.

By using a free running ADC clock, i.e. the local (ADC) clock time base being independent of the system clock time base, restrictions regarding the location of the ADC with respect to components requiring synchronization with the system clock can be overcome. This enables alternate implementation topologies in which the analogue components can be further localized and reduced in size. In particular, this enables RF receive coil assemblies, typically consisting of a coil element board (CEB) and a digital receiver module (RXE), to be implemented with a single type of analogue subassembly and fully digital signal transport by optical means, totally eliminating RF transmit field interactions with RF signal transport cables.

In accordance with an embodiment of the invention, the analogue-to-digital converter, the local clock oscillator and further electronic analogue reception components of the RF coil are comprised on a coil element board (CEB). Electronic analogue reception components are for example a pre-amplifier, as well as a tuning and matching circuitry and a circuitry to detune the coil element during transmit. Further, the phase detector and the resampling unit are comprised on a digital receiver module (RXE), wherein the coil element board and the digital receiver module are specially separated. Further, a communication connection between the coil element board and the digital receiver module is a pure digital communication connection. By such a receiver design, the sensitivity of the receiver to RF transmit field interactions is drastically reduced, since the signal path through analogue components is limited to the CEB. Further, as already mentioned above, the analogue components can be localized and further reduced in size.

In accordance with a further embodiment of the invention, the receiver further comprises an encoder coupled to the analogue-to-digital converter for encoding the digital sampling input signal to a digital transport signal, a decoder coupled to the resampling unit for decoding the digital sample input signal from the digital transport signal, as well as a clock recovery module coupled between said encoder and said decoder. The clock recovery module is adapted for recovering the local clock from the digital transport signal, wherein the local clock used by the phase detector for determining the phase difference is the local clock recovered by the clock recovery module.

This has the advantage that the local clock is not required to be transmitted separately from the local clock oscillator to the phase detector. This further reduces the complexity of electronic components.

In accordance with a further embodiment of the invention, the encoder is adapted for providing a clock and data recovery compatible encoding of the digital sampling input signal. For example, an 8B/10B encoding or a 64B/66B encoding may be used.

This has the advantage, that the ADC data may be transported over a unidirectional serial connection enabling an implementation based on standard digital communication components. This might, for example, be implemented as a galvanic low voltage differential signalling (LVDS) path or as an optical path with optical transmitter at the ADC end and an optical receiver at the resampler end. The use of an optical path further facilitates RF coil design as it fundamentally eliminates RF interactions with the RF transmit field.

In accordance with a further embodiment of the invention, the phase detector comprises a first counter, a second counter and a phase calculation circuit, the first counter counting local clock pulses and the second counter counting system clock pulses, wherein the phase calculation circuit is adapted for calculating the phase difference between the system clock and the local clock from the counting difference of the first and second counter. This allows implementing the phase detector through purely digital means, avoiding the inherent fidelity issues associated with an analogue solution and enabling miniaturization and integration through standard digital techniques.

In another aspect, the invention relates to a magnetic resonance imaging apparatus comprising an RF coil and a direct digital receiver according to the invention.

In another aspect, the invention relates to a method of providing an RF signal of an RF coil, in particular of a magnetic resonance imaging system, as a digital sample output signal at a digital operating frequency in time base of a system clock, wherein the method comprises converting by an analogue-to-digital converter the analogue RF signal received from the RF coil to a digital sample input signal, wherein the analogue-to-digital converter is driven by a local clock, wherein a local clock oscillator is providing the local clock in a local clock time base to the analogue-to-digital converter, the local clock time base being independent of the system clock time base. The method further comprises determining a phase difference between the system clock and the local clock and resampling the digital sample input signal to the digital sample output signal using said phase difference.

It has to be mentioned, that the method of the invention can be advantageously carried out in most MR devices in clinical use at present. To this end, it is merely necessary to utilize a computer program by which the MR device is controlled such that it performs the above explained method steps of the invention. The computer program may be present either on the data carrier or be present in a data network so as to be downloaded for installation in the control unit of the MR device. Therefore, the invention also relates to a computer program product comprising computer executable instructions to perform the method as described above.

It further has to be mentioned, that preferably all components on the digital side of the direct digital receiver may be implemented in software.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF EMBODIMENTS

Figure 1:
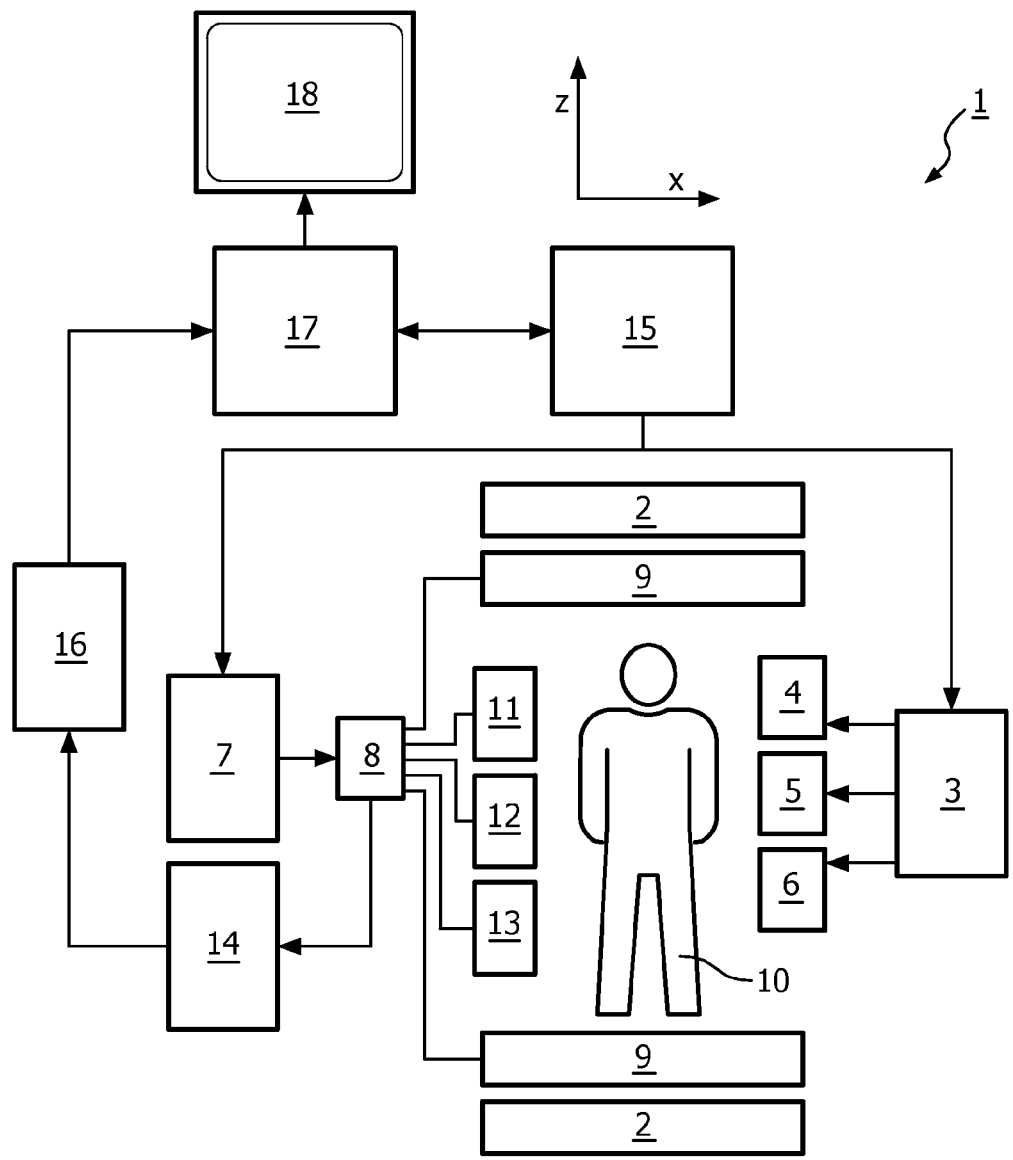
FIG. 1 shows a state of the art MR device.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

Most specifically, a gradient pulse amplifier 3 applies current pulses to selected ones of whole-body gradient coils 4, 5 and 6 along x, y and z-axes of the examination volume. A RF frequency transmitter 7 transmits RF pulses or pulse packets, via a send-/receive switch 8, to a whole-body volume RF coil 9 to transmit RF pulses into the examination volume. A typical imaging sequence or navigator sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analogue-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Instead of using a separate receiver 14 and a separate data acquisition system 16 performing analogue-to-digital conversion of the received signals, according to the present invention a direct digital receiver for the RF coils is used. As a consequence, the switch 8 and the analogue-to-digital converter 16 are integrated in a coil element board. Additionally, a digital receiver module is provided which processes the digitized signals and resamples them in a desired manner such that the signals can be used for reconstruction by the reconstruction processor 17.

Figure 2:
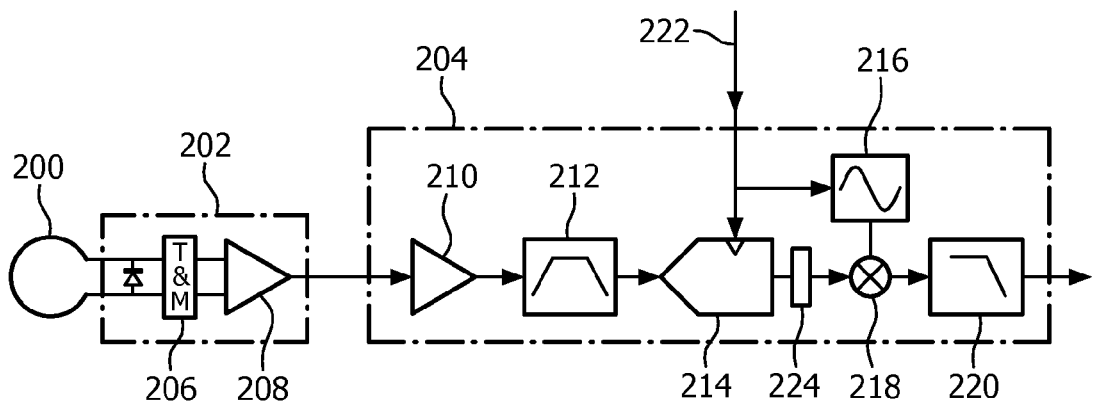
FIG. 2 shows a schematic diagram of a conventional digital coil assembly with partitioning of functions.

FIG. 2 illustrates a schematic diagram of a conventional direct digital receiver with partitioning of functions. The direct digital receiver is a digital coil assembly consisting of a coil element board (CEB) 202 and a digital receiver module (RXE) 204. Analogue electronics associated with each coil element 200 consists of a preamplifier 208, as well as a tuning and matching circuitry 206, as well as a circuitry to detune the coil element during transmit. The components 206 and 208 are located on the CEB 202.

The RXE 204 comprises an amplifier 210, a band pass filter 212, an analogue-to-digital converter (ADC) 214, a demodulator 218, a low pass filter 220, a resampler 224 as well as an oscillator 216. The demodulator 218, low pass filter 220 and oscillator 216 together comprise what is commonly referred to as a digital down converter (DDC). The system clock 222 is provided to the ADC 214 such that frequency lock to the system clock is ensured.

Direct digital receivers as shown in FIG. 2 and also as used in the present invention preferably use bandwidth limited undersampling to avoid an intermediate frequency (IF). This eliminates the associated analogue mixer to transform the MR carrier frequency down to a frequency suitable for analogue-to-digital conversion. The elimination of an intermediate frequency and associated mixer reduces the analogue component count significantly. The digital implementation of these functions enables extreme miniaturization and power saving through standard digital integrated circuit technology.

To provide system design freedom and simplify anti-aliasing filter design, a resampling DDR is used. This technique allows the ADC sampling frequency to be chosen independently of the frequency at which subsequent digital functions such as demodulation and filtering are controlled and processed.

Nevertheless, in FIG. 2 the resampling DDR still requires the ADC sampling frequency to remain in frequency lock with the system clock 222 used to control the time critical digital functions of the system. As a consequence, the system clock 222 has to be received from an external source and provided to both, the ADC 214 and the demodulation oscillator 216. Further, the ADC 214 additionally requires a converter (not shown here) to convert the system clock to the appropriate ADC sampling frequency. This limits the design freedom regarding the ADC and associated clock locations since for driving the ADC the system clock always has to be made available at the ADC.

Figure 3:
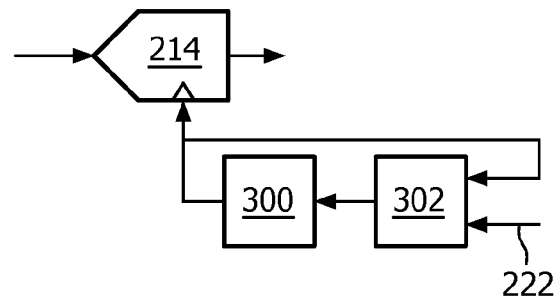
FIG. 3 shows an ADC controlled through a voltage controlled crystal oscillator.

As illustrated in FIG. 3, frequency lock for a high fidelity ADC clock is typically implemented in state of the art system via a phase locked loop (PLL) consisting of an analogue phase detector 302 and a voltage controlled crystal oscillator (VCXO) 300, wherein the phase detector 302 receives as input the system clock 222 and the local clock output of the voltage controlled crystal oscillator 300.

The system clock in such a circuit is commonly recovered directly from the control data stream transmitted by the system. Frequency lock on the ADC clock has two disadvantages, namely the clock distribution to the ADC and the introduction of noise present on the system clock and the ADC clock.

Figure 4:
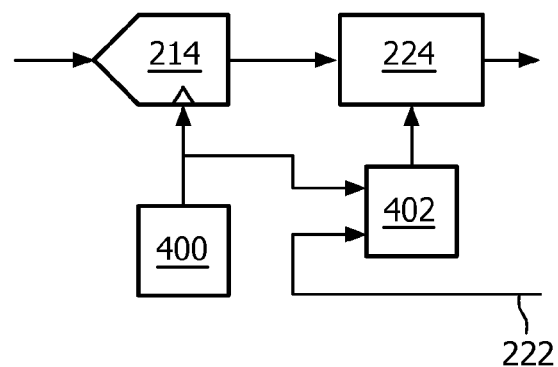
FIG. 4 illustrates an ADC driven by a free running ADC clock.

In order to overcome these problems a free running ADC clock may be derived directly from a crystal oscillator 400 as shown in FIG. 4. An additional advantage of this approach is that voltage control is no longer required on the oscillator; a simpler crystal oscillator will suffice.

It has to be noted, that the term "free running ADC clock" is to be understood as a local clock with the local clock time base being independent of the system clock time base. The usage of a free running ADC clock requires extending the resampler 224 of the resampling DDR to account for the frequency offset of the free running ADC clock. This is realized in FIG. 4. The local clock of the crystal oscillator 400 of the ADC 214 is input together with the system clock 222 to a phase detector 402, wherein the phase detector 402 is adapted for determining the phase difference between the system clock and the local clock. This phase difference is then used by the resampling unit 224 for resampling the digital sample signal received from the ADC 214 to a desired digital sample output signal using said phase difference.

The ADC clock is now no longer contaminated by noise on the system clock. To remove the restriction on the location of the ADC it is convenient to code the output of the ADC to enable transfer over a serial digital link. A common coding scheme is the so called 8 to 10 bit coding (8B/10B coding) used by various serial digital mmunication protocols. This coding scheme enables clock recovery and thereby allows the ADC clock to be recovered from the ADC data path itself. This results in the circuit illustrated in FIG. 5.

Figure 5:
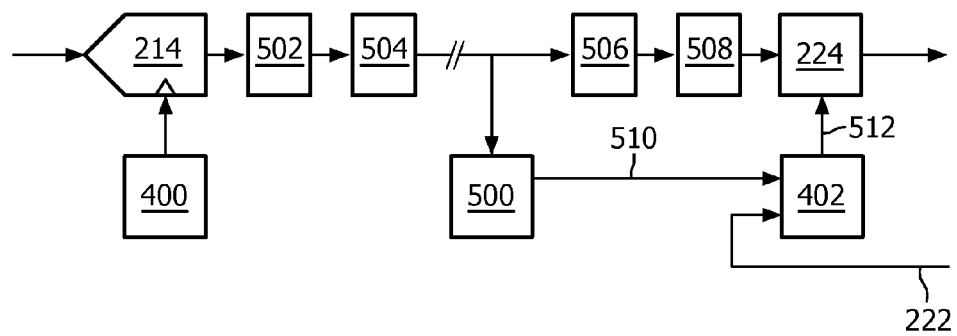
FIG. 5 illustrates the usage of 8/10 bit encoding to enable ADC clock recovery over a serial connection.

In the circuit shown in FIG. 5, the local clock oscillator 400 provides a local clock to the ADC 214. The analogue signal input to the ADC 214 is digitized by the ADC and encoded by the encoder 502 using for example 8B/10B encoding. The serializer 504 and the deserializer 506 enable transmission over a serial link. From the data stream transmitted between the serializer and the deserializer, a clock recovery module 500 is able to recover the local ADC clock. This local ADC clock 510 is then input together with the system clock 222 into the phase detector 402. The detected phase difference is finally used by the resampler 224 for resampling the data stream after deserialization and decoding using the decoder 508. Here, the decoder 508 is a 10/8 bit decoder.

Preferably, for transmission of the ADC data between the serializer and the deserializer, an optical path with optical transmitter at the ADC end and an optical receiver at the resampler end is preferred.

Detecting the ADC clock phase consists of determining the ADC clock frequency expressed in system clock units. For example, the implementation of such detector 402 may comprise two counters 602 and 606, as illustrated in detail in FIG. 6.

Figure 6:
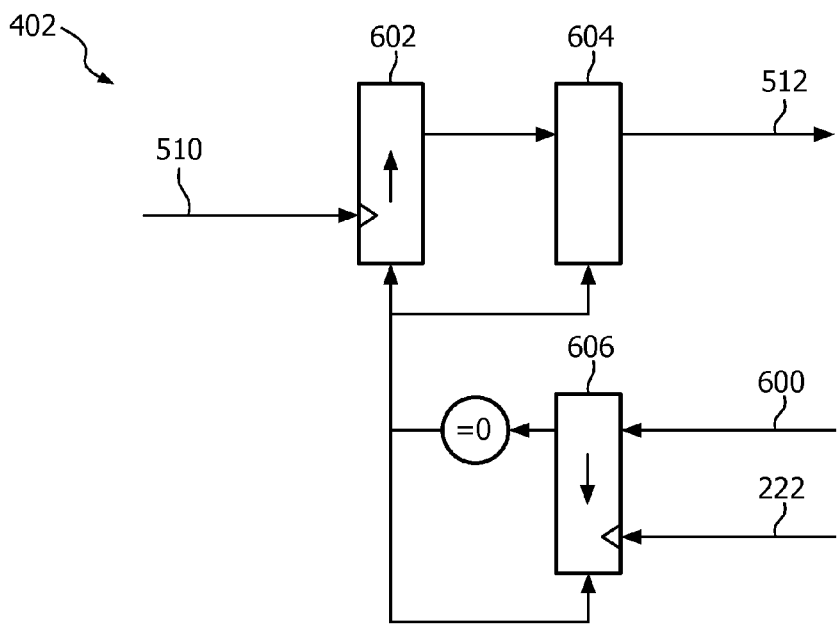
FIG. 6 illustrates a fully digital ADC clock phase detector.

In FIG. 6, the counter 602 is counting recovered ADC clock pulses 510 and the counter 606 is counting system clock pulses 222. Further a counting period 600 may be specified to the phase detector. The difference in these two counters 602 and 606 normalized by the counting period 600 defines the frequency and phase offset between the ADC clock and the system clock. Here, counting is performed for example by a 26 bit phase counter 604 adapted for calculating the phase difference between the system clock and the local clock.

By counting over a prolonged period of time, the accuracy of the phase offset can be increased to an arbitrary degree. The counting period, however, should preferably be matched to the typical stability of the ADC clock oscillator.

For example, when operating at 50 MHz, a detection period of about 1 second requires 26 bit counters and results in a frequency error of less than 1 Hz.

Rather conveniently, the detected ADC phase exactly defines the phase step required by the resampler. The phase count can be used directly as input to the resampler.

Whereas a state of the art resampler as illustrated in FIG. 2 allows only frequencies in multiples of 1 MHz, the resampler required here must be able to resample frequencies with much higher precision. The required precision must significantly exceed the acquired signal bandwidth.

The restriction to multiples of 1 MHz in the state of the art resample design is imposed to limit the number of interpolator coefficients and the corresponding size of the interpolator coefficient table. This table size limit can be maintained by using the increased phase precision to perform interpolation in coefficients defined for a limited number of frequencies. For example by detecting $50 \times 2^{20}$ 50 MHz clock periods the resulting phase counter will hold the phase in 1 MHz precision in bit 20 and higher with the lower order 20 bits defining the fractional phase. The interpolation might be limited to a 12 bits interpolation to match the number of resampler coefficient bits. Only the higher order 12 bits of the phase fraction are then required by the resampler.

Figure 7:
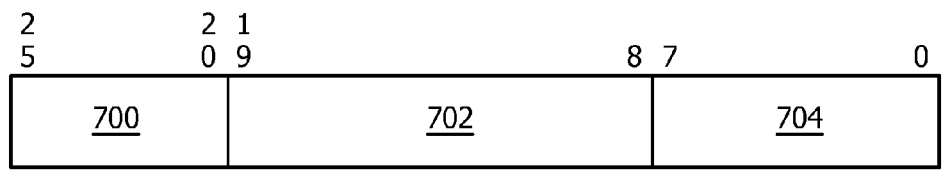
FIG. 7 illustrates an ADC clock phase format.

FIG. 7 illustrates the phase counter word format. Here, the phase counter has to be understood as the phase of the ADC clock frequency with respect to the system clock frequency. In FIG. 7, bits 25-20 (reference numeral 700) define the resampling phase in MHz. Bits 19-8 define a 12 bit fractional phase for interpolation of resampler coefficients (reference numerals 702). Bits 7-0 or unused bits (reference numeral 704).

Figure 8:
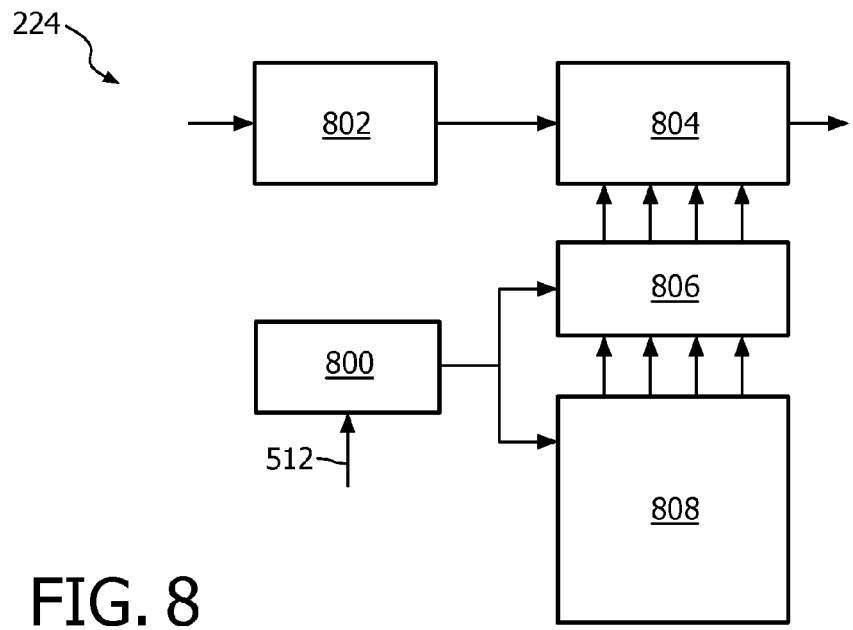
FIG. 8 illustrates a resampler with additional interpolation of coefficients.

The resampler now requires an additional stage to interpolate coefficients stored in the coefficient table. This is illustrated in FIG. 8. The resampler 224 illustrated in FIG. 8 comprises a sample transfer unit 802, a phase counter 800, an interpolator 804 and a coefficient table unit 808. The phase value is supplied to the resampler periodically, for example at the end of each detection period by the phase detector. The index 6 bits (bits 20-20) are input to the 12 bit coefficient table, whereas the fraction 12 bits (bits 19-8) are input to the coefficient interpolator.

In operation, the resampler first transfers samples of an input digital sample signal (for example from an ADC) acquired at an ADC sampling frequency to the electronics operating at a digital operating frequency, i.e. the frequency of the system clock. Subsequently, the transferred samples are interpolated to generate samples of a second digital sample signal at the digital operating frequency. The relative phase of the sampling frequency of the first digital input sample signal with respect to the digital operating frequency of the system clock determines when to transfer a sample.

The use of a 26 bit phase counter in the resampler and a 1 second frequency detect period ensures 1 Hz frequency accuracy. This is sufficient to ensure resampling accuracy to the requirements imposed by most MR imaging and spectroscopy applications. However, higher accuracy can be obtained when required simply by counting for a longer period of time.

It has to be noted that all although the accuracy of the ADC frequency is 1 Hz in the above design, the precision with which the interpolation is performed is only 250 Hz. This is normally not an issue as the signal bandwidth at which the signal is acquired as proportional to the required accuracy. A lower signal bandwidth requires a higher reduction factor and consequently an increase in precision due to the averaging performed by the bandwidth limiting filter. This increase is proportional to the square-root of the reduction factor. In other words, also the frequency precision of each individual sample point is limited, the frequency precision of the signal filter to the acquired signal bandwidth is increased by the square-root of the reduction factor with a maximum of the frequency accuracy corresponding to the counting period.

For example, at a signal bandwidth of 1 MHz, the reduction factor is 50 and the resulting frequency precision is ~250 Hz/$\sqrt{50}$=~36 Hz. A signal bandwidth of 5 KHz requires a reduction factor of 10.000 and results in a frequency precision of ~250 Hz/$\sqrt{10.000}$=~2.5 Hz.

If the frequency precision of the resampler were to remain 1 MHz, as in the current resampler design without a coefficient interpolator, then the frequency precision at a 1 MHz signal bandwidth would only be about 140 KHz and at a signal bandwidth of 5 KHz only about 10 KHz.

In practice, commercial crystal oscillators provide a frequency accuracy of ≤50 ppm or ≤2.500 Hz at 50 MHz. The frequency precision of the above design is therefore well below the expected accuracy and is sufficient to compensate for production spread in crystal oscillator frequency. If increased precision is required, then additional bits are required in both the resampler coefficients and the interpolation stages.

Figure 9:
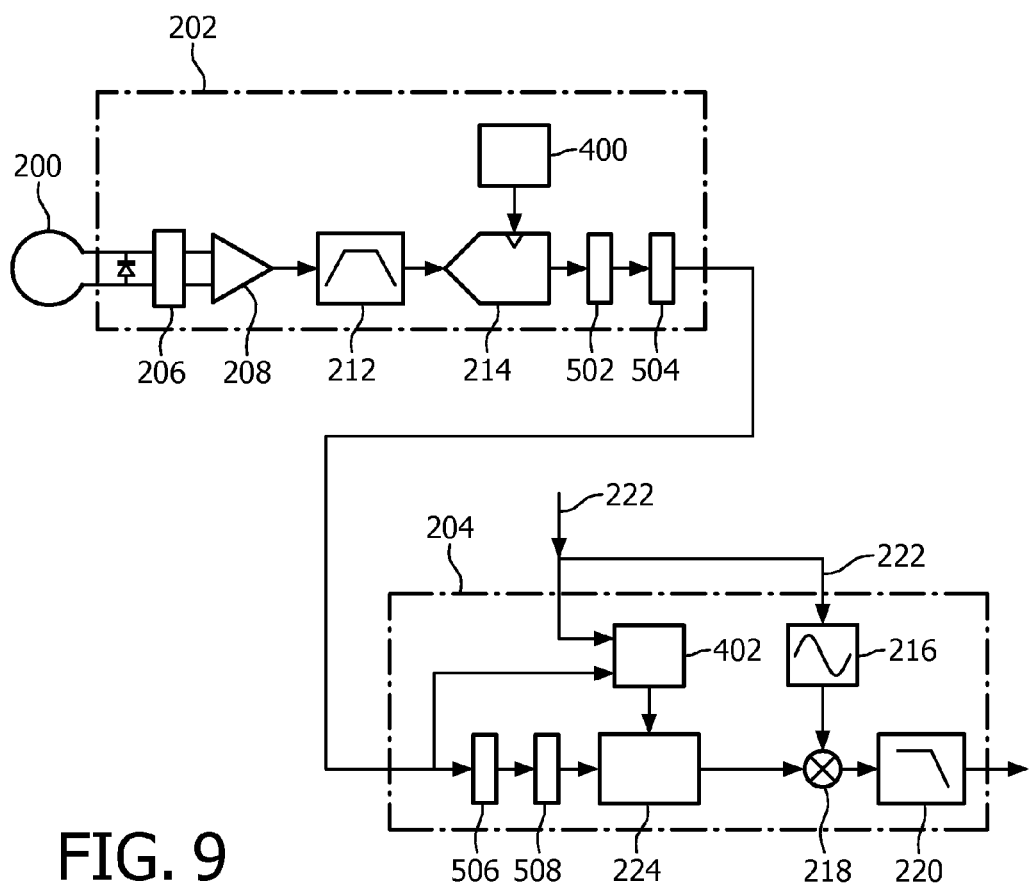
FIG. 9 shows a schematic diagram of a digital coil assembly with partitioning of functions according to the invention.

FIG. 9 shows a schematic diagram of a direct digital receiver according to the invention. The receiver comprises again two components, namely the CEB 202 and the RXE 204. In the receiver design in FIG. 9, the anti aliasing filter 212 and the ADC 214 are moved to the CEB 202 and RF signal transport between the CEB and the RXE is fully digital and potentially optical. The externally available system clock 222 is only provided to the phase detector 402 and the demodulation oscillator 216 in the RXE 204, whereas the local clock oscillator 400 driving the ADC 214 is working in a stand alone manner, i.e. autonomic. Therefore, clock information is transmitted in a serialized and encoded manner digitally from the ADC 214 to the resampler 224. A clock recovering module not shown in FIG. 9 is able to perform a clock recovery from the transmitted signal such that the phase detector 402 is able to determine a relative phase of the sampling position of the ADC with respect to the system clock 222.

The use of a DDR within the coil assembly illustrated in FIG. 9 enables significant reduction of signal bandwidth for transfer over conventional digital networks. If sufficient network bandwidth is available, an alternate implementation could send the ADC data directly to a computer for processing in software. Phase detection is still required either by purely software means for example by correlating the acquired signal with other signals or via the addition of an explicit phase detector on each communication channel.

The topology in FIG. 9 has various characteristics: One characteristic is that all analogue RF components are restricted to the CEB. Further, all RF signal transport is fully digital. This enables reliable optical signal transport with complete immunity to RF transmit field interactions. Further, the RXE is fully digital eliminating the engineering challenges associated with a mixed signal design. There is no need for a high fidelity clock in the RXE and a clock recovery based on a simple voltage controlled oscillator for the digital link to the system is sufficient to maintain synchronization with other system components. It has to be noted that instead of a voltage controlled oscillator any kind of reliable and stable clock oscillator can be used.

Further, a characteristic of the topology illustrated in FIG. 9 is that the ADC clock is derived directly from a local clock oscillator (reference numeral 400). The ADC clock is free running thereby preserving the excellent short term fidelity of the crystal oscillator. Through the use of a free running oscillator, for example a crystal oscillator instead of a voltage controlled oscillator in a phase locked loop (PLL), the ADC clock is not contaminated by noise on the voltage control signal. Further all frequency dependent components may be isolated to a single component (CEB). The RXE is no longer frequency dependent. Even so it is still necessary to configure the ADC clock frequency, the RXE has no frequency dependent components thereby reducing component type count.

The further characteristic of the topology of FIG. 9 is that also the component count of the CEB has increased, there is room for miniaturization possibilities through hybrid integrated circuit techniques. The number of CEBs required during production can be substantially justifying the development of an ASIC (application specific integrated circuit). An ASIC is an integrated circuit customized for particular use, rather than intended for general purpose use. As a consequence, it is not possible anymore to manipulate the function of an ASIC. However, the production costs are lower.

Finally, one characteristic of the topology of FIG. 9 is that additional RF coil design freedom is provided enabling alternative component topologies. This can for example be used to achieve a more uniform power distribution.

The invention claimed is:

1. A receiver for an radio frequency coil, the receiver comprising:
an analog-to-digital converter configured to convert an analog signal received from the radio frequency coil to a digital input signal, wherein the analog-to-digital converter is driven by a first clock,
a first clock configured to provide the first clock at a first frequency to the analog-to-digital converter,
wherein the receiver is configured to provide an output signal at a second frequency,
wherein the second frequency is provided from a second clock,
wherein the first frequency is independent of the second frequency,
a phase detector configured to determine a phase difference between the first frequency and the second frequency,
a resampling unit configured to resample the input signal to create the output signal using said phase difference.

2. The receiver of claim 1, further comprising:
a circuit board comprising the analog-to-digital converter, the first clock oscillator and analog reception components of the radio frequency coil;
a digital receiver module comprising the phase detector and the resampling unit,
wherein the circuit board and the digital receiver module are spatially separated; and
a communication connection disposed between the circuit board and the digital receiver module, wherein the communication connection is only a digital communication connection.

3. The receiver of claim 1, further comprising:
an encoder coupled to the analog-to-digital converter, and the encoder configured to encode the digital input signal into a digital transport signal;
a decoder coupled to the resampling unit, and configured to decode the digital input signal from the digital transport signal; and
a clock recovery module coupled between said encoder and said decoder, the clock recovery module being configured to recover a recovered first clock from the digital transport signal, wherein the first clock used by the phase detector to determine the phase difference is the recovered first clock.

4. The receiver of claim 3, wherein the encoder is configured to provide a clock and data recovery compatible encoding of the digital sampling input signal.

5. The receiver of claim 3, further comprising a serializer and a deserializer coupled between the encoder and the decoder, wherein the serializer is configured to serialize the digital transport signal and the deserializer is configured to deserialize the digital transport signal, wherein the serializer and deserializer are driven by the first clock, and the clock recovery module is configured to recover the first clock from the serialized digital transport signal.

6. The receiver of claim 1, wherein the phase detector comprises a first counter, a second counter and a phase calculation circuit, the first counter counting first clock pulses and the second counter counting second clock pulses, the phase calculation circuit is configured to calculate the phase difference between the second frequency and the first frequency from the counting difference of the first and second counter.

7. A magnetic resonance imaging device comprising the radio frequency coil and the receiver as claimed in claim 1.

8. A method of providing an analog radio frequency signal of an radio frequency coil as a digital output signal at a second frequency, the method comprising:
providing a first clock generating a first frequency to an analog-to-digital converter, wherein the first frequency is independent of the second frequency:
analog to digital converting the analog radio frequency signal received from the radio frequency coil to a digital input signal, wherein the analog-to-digital converter is driven by first clock,
determining a phase difference between the second frequency and the first frequency,
resampling the digital input signal to the digital output signal using said phase difference.

9. The method of claim 8, further comprising:
encoding the digital input signal to a digital transport signal;
decoding the digital input signal from the digital transport signal;
recovering the first clock from the digital transport signal; and
determining the phase difference using is the recovered first clock.

10. The method of claim 9, further comprising:
providing a clock and data recovery compatible encoding of the digital sampling input signal.

11. The method of claim 9, further comprising:
serializing the digital transport signal; and
deserializing the digital transport signal, wherein the serializing and deserializing are driven by the first clock; and
recovering the first clock from the serialized digital transport signal.

12. The method of claim 8, further comprising:
counting second clock pulses,
calculating a phase difference between the second frequency and the first frequency.

13. A non-transitory computer readable medium comprising instructions, executable on a computer, to cause a magnetic resonance imaging device to provide an radio frequency signal of an radio frequency coil as a digital output signal second frequency, the method comprising:
providing a first clock, first clock providing a first frequency to an analog-to-digital converter, the wherein the first frequency is independent of the second frequency;
analog-to-digital converting the analog radio frequency signal received from the radio frequency coil to a digital input signal, wherein the analog-to-digital converter is driven by the first clock,
determining a phase difference between the second frequency and the first frequency,
resampling the digital input signal to the digital output signal using said phase difference.

14. The non-transitory computer readable medium of claim 13, the method further comprising:
encoding the digital input signal to a digital transport signal;
decoding the digital input signal from the digital transport signal;
recovering the first fequency from the digital transport signal; and
determining the phase difference using recovered first frequency.

15. The non-transitory computer readable medium of claim 13, the method further comprising:
providing a clock and data recovery compatible encoding of the digital input signal.

16. The non-transitory computer readable medium of claim 13, the method, further comprising:
serializing the digital transport signal; and
deserializing the digital transport signal, wherein the serializing and deserializing are driven by the first clock; and
recovering the first frequency from the serialized digital transport signal.

17. The non-transitory computer readable medium of claim 13, the method further comprising:
counting clock pulses of the second frequency,
calculating a phase difference between the second frequency and the first frequency.

* * * * *